United States Patent
Mori (10) Patent No.: US 6,718,057 B1
(45) Date of Patent: Apr. 6, 2004

(54) POSITION ERROR MEASUREMENT METHOD AND DEVICE USING POSITIONING MARK, AND MACHINING DEVICE FOR CORRECTING POSITION BASED ON RESULT OF MEASURING POSITION ERROR USING POSITIONING MARK

(75) Inventor: Toshihiro Mori, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 632 days.

(21) Appl. No.: 09/606,089

(22) Filed: Jun. 29, 2000

Related U.S. Application Data (63) Continuation of application No. PCT/JP98/05793, filed on Dec. 22, 1998.

(51) Int. Cl.[7] .................................................. G06K 9/00
(52) U.S. Cl. ........................ 382/141; 382/151; 382/298; 382/305; 250/491.1; 355/55; 348/95; 348/142
(58) Field of Search .................................. 382/141, 151, 382/152, 166, 169, 287, 216, 286, 291, 294, 298, 305, 312; 356/620, 625, 356, 385, 399–401; 250/491.1, 492.23, 559.06, 559.45, 397, 548; 355/53, 55, 72–76; 348/87, 94, 95, 126, 136, 137, 142, 151, 190, 208.12

(56) References Cited

U.S. PATENT DOCUMENTS

| | | | | |
|---|---|---|---|---|
| 4,860,374 A | * | 8/1989 | Murakami et al. | 382/151 |
| 4,962,423 A | * | 10/1990 | Yamada et al. | 382/144 |
| 5,747,202 A | * | 5/1998 | Tanaka | 430/30 |
| 5,851,848 A | * | 12/1998 | Balamurugan | 438/33 |
| 5,923,990 A | * | 7/1999 | Miura | 438/401 |
| 6,097,495 A | * | 8/2000 | Uzawa et al. | 250/548 |

FOREIGN PATENT DOCUMENTS

| | | |
|---|---|---|
| JO | A 8-37615 | 2/1996 |
| JP | SHO 60-163183 | 8/1985 |
| JP | SHO 62-51233 | 5/1987 |
| JP | A 62-223605 | 10/1987 |
| JP | A 63-196803 | 8/1988 |
| JP | A 2-58847 | 2/1990 |
| JP | A 5-54127 | 3/1993 |
| JP | A 5-196420 | 8/1993 |
| JP | A 5-302814 | 11/1993 |
| JP | A 6-124987 | 5/1994 |
| JP | A 8-1591 | 1/1996 |
| JP | A 10-256351 | 2/1996 |
| JP | A 9-270945 | 10/1997 |

* cited by examiner

Primary Examiner—Jayanti K. Patel
Assistant Examiner—Sheela Chawan
(74) Attorney, Agent, or Firm—Sughrue Mion, PLLC (57) ABSTRACT

A positioning mark (21 to 24) is positioned and fixed with predetermined accuracy with respect to an image information detection unit (1, 2), and when the image information detection unit (1) having a narrow visual field can detect the positioning mark (21 to 24), position error of a workpiece (7) to be machined is determined based on the detected image information. On the other hand, when the image information detection unit (1) having the narrow visual field can not detect the positioning mark (21 to 24), the image information detection unit (2) having a wide visual field detects image information of the positioning mark (21 to 24), corrects a relative position between the image information detection unit (2) having the wide visual field and the workpiece (7) based on the position errors of the workpiece (7) obtained from the detected image information, and the image information detection unit (1) having the narrow visual field detects image information for the positioning mark (21 to 24) to determine position errors of the workpiece 7 based on the detected image information.

6 Claims, 9 Drawing Sheets

POSITION ERROR MEASUREMENT METHOD AND DEVICE USING POSITIONING MARK, AND MACHINING DEVICE FOR CORRECTING POSITION BASED ON RESULT OF MEASURING POSITION ERROR USING POSITIONING MARK

This application is a continuation of International Application PCT/JP98/05793, with an international filing date of Dec. 22, 1998, which designated the United States, the entire contents of which are hereby incorporated by references.

TECHNICAL FIELD

The present invention relates to a position error measurement method and a device that uses a positioning mark, which determines a position of a mark on a workpiece to be machined and performs positioning correction based on the position of this mark. Further, the invention relates to improvement in a machining device which corrects the position of the workpiece based on the result of measuring the position errors using the mark.

BACKGROUND ART

Figure 7:
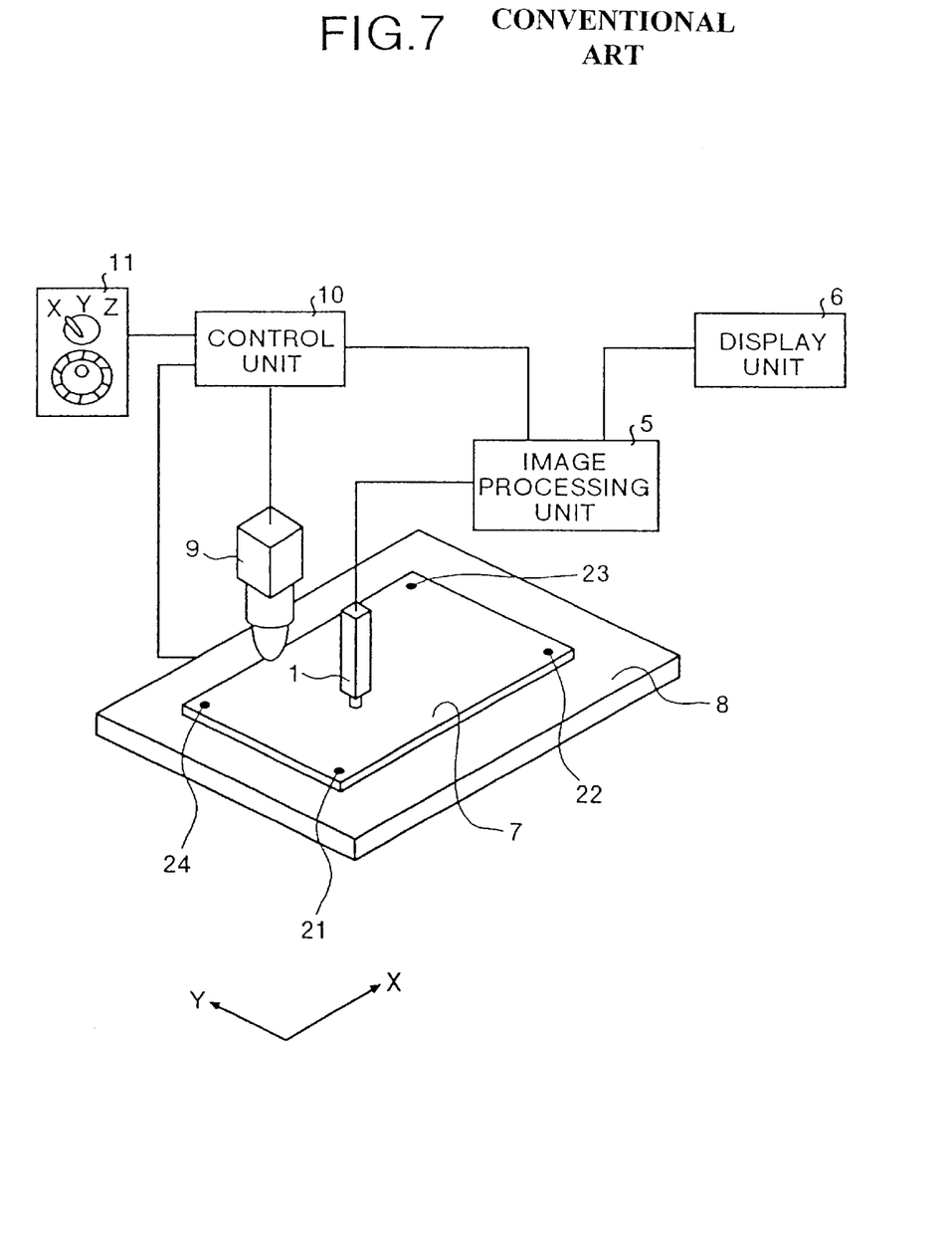
FIG. 7 is a block diagram showing a conventional type of machining device which corrects a position based on the result of measuring position errors using a positioning mark.

FIG. 7 shows an example of the configuration of a conventional machining device. This device determines a position of a mark on a workpiece to be machined and corrects the position based on the determined position of the mark. Such a device is generally used when drilling holes in a printed board. In this FIG., 1 is a camera with a lens having a narrow visual field, 5 is an image processing unit which performs image processing to images obtained by the camera 1, 6 is a display unit which displays the images obtained the camera 1 and the result of processing in the image processing unit 5, 7 is a workpiece to be machined, 8 is an XY table which performs positioning of the workpiece 7, 9 is a tool with which the workpiece 7 is machined, 10 is a control unit which provides controls for image processing, positioning correction, and machining, or the like, 11 is a manual pulse generator, and 21 to 24 are positioning marks (that is, marks used for positioning).

Since high-positioning accuracy is required for an operation such as drilling in a printed board, it is required to use any camera with a narrow visual field and high resolution as one used for positioning correction as explained above.

Operation of this device is explained below with reference to FIG. 7. The workpiece 7 is fixed to the XY table 8, and positioning is corrected by the XY table 8 before machining is performed. The correction for positioning is performed by positioning the XY table 8 in the X direction and the Y direction by not shown X-axial driving system and Y-axial driving system based on instructions of the control unit 10. The amount of correction for positioning is determined by moving the camera 1 to the preset reference position of a positioning mark, performing image processing to the mark by the image processing unit 5, and measuring position errors between the reference position and the positioning mark.

Figure 8:
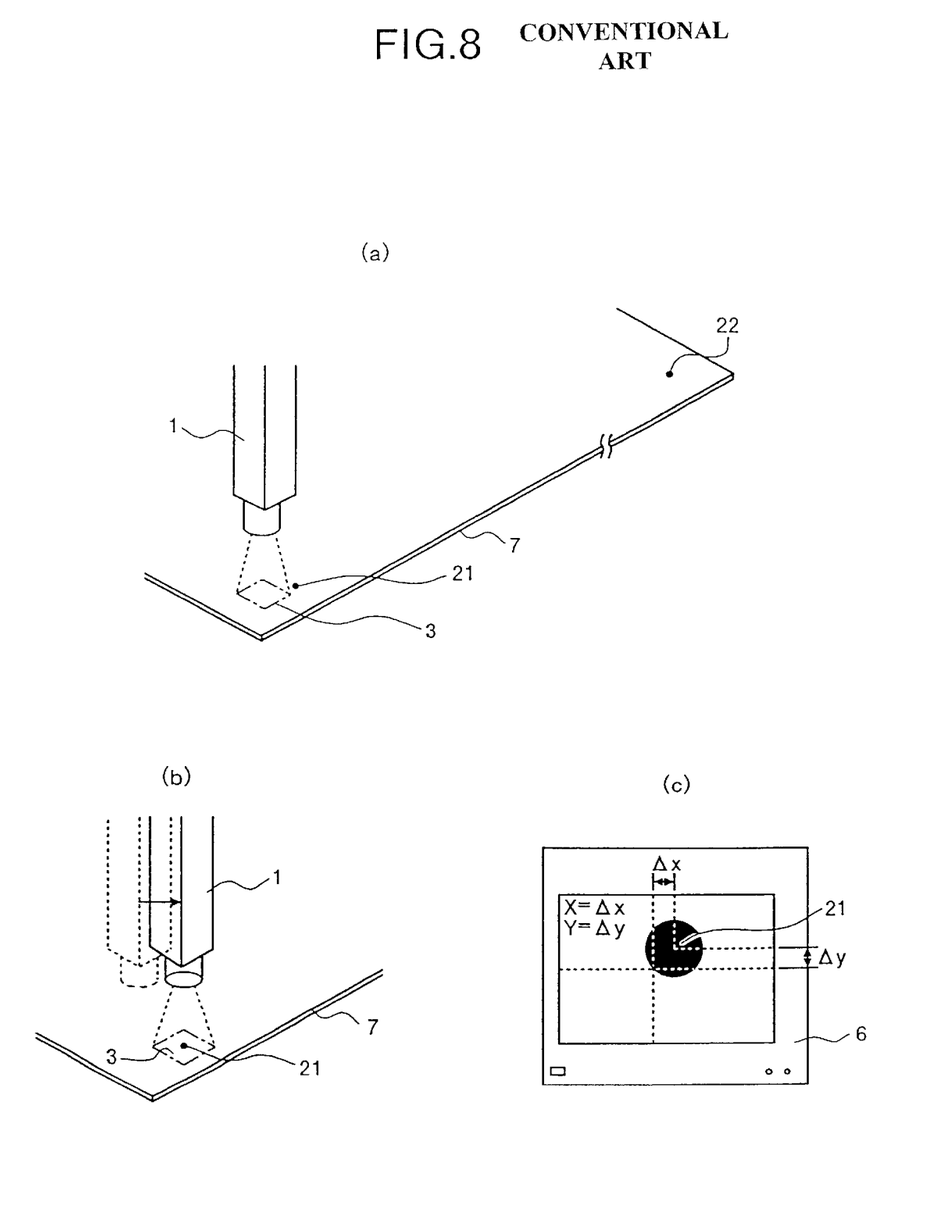
FIG. 8 shows explanatory views showing an example of measuring position errors using a positioning mark through image processing based on the conventional technology.

FIG. 8 shows an example of measuring position errors using a positioning mark through image processing. In this FIG. 3 represents a visual field of the camera 1. As explained above, the visual field 3 of the camera 1 is narrow because a high-positioning accuracy is required. As shown in FIG. 8 (*a*), when a positioning mark 21 is not within the narrow visual field 3 of the camera 1, the positioning mark is not found even when the image processing is performed in the image processing unit 5, therefore, an error in recognition occurs. On the other hand, if the positioning mark 21 is within the narrow visual field 3 of the camera 1, the error in recognition does not occur.

In FIG. 7, when the positioning mark 21 can not be recognized by the image processing unit 5, alarm information indicating the error in recognition or the like is transmitted from the image processing unit 5 to the control unit 10. The control unit 10 generates an alarm or the like so that the operator can easily understand the situation. When the operator hears the alarm he moves the camera 1 at a position such that the positioning mark 21 comes inside the narrow visual field 3 of the camera 1 by using the manual pulse generator 11 of the control unit 10 (see FIG. 8 (*b*)), and allows the image processing unit 5 to perform image processing again. FIG. 8 (*c*) shows an example of displaying the result of measuring position errors of the positioning mark on the display unit 6. The camera 1 is then moved to the position of the next positioning mark, and the position is automatically measured.

The operation of measuring position errors of the positioning mark as explained above is executed some times corresponding to the preset number of points of positioning marks to be measured, position errors of a machining point on the workpiece 7 are determined through operations in the control unit 10 from the data for the measured position errors of the positioning mark, the position errors of the machining point are corrected, and the machining point on the workpiece 7 whose position errors have been corrected is machined with the tool 9 in FIG. 7. In this type of machining device which corrects the position of the workpiece based on the result of measuring position errors using a positioning mark in the conventional manner, when a positioning mark is not found, an error in recognition occurs in the image processing unit. In this case, a lot of manual operations are required and also a lot of time is spent to correct positioning. That is, the operator has to manually move the camera so that the positioning mark comes inside the visual field of the camera, and image processing is performed again to the mark, and so forth.

As explained above, when the object is not inside the visual field of the camera, the processing is troublesome. To solve the problem, there is a position error measurement device disclosed in JP60-163183A shown in FIG. 9 as the technology that the processing is performed by changing the size o f the visual field of the camera. In this FIG. 101 is an object region where an object 102 to be recognized may exist, 103 is a camera with a built-in electric zoom lens 104 that is selectable between a wide visual field and a narrow visual field, 105 is a two-dimensional positioning device which moves the camera 103 to any position within the object region 101, and 106 is a visual sensor control unit. This visual sensor control unit 106 comprises a zoom lens driving unit 107 that drives the electric zoom lens 104, a positioning control unit 108 for the two-dimensional positioning device 105, an image processing unit 109 that processes an image captured from the camera 103, and a central processing unit 110 that integrally controls these devices.

Figure 9:
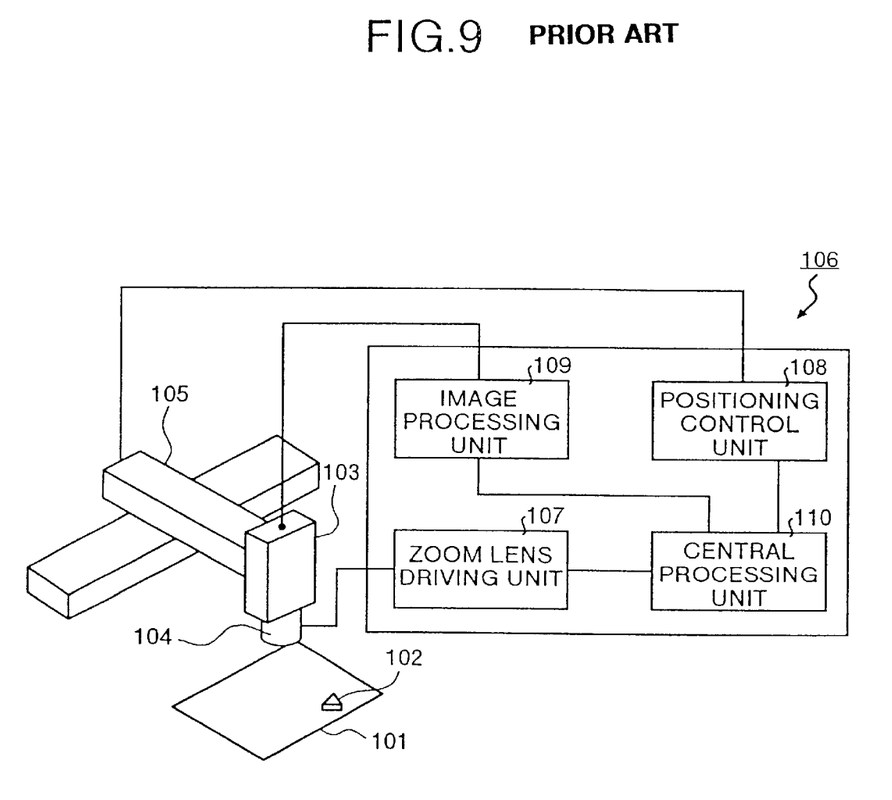
FIG. 9 is a block diagram showing the conventional type of position error measurement device.

The camera 103 is positioned at the center of the object region 101. Further, visual field of the electric zoom lens 104 is set to wide visual field. Therefore, the overall object region 101 is displayed within the image obtained by the camera 103. The object 102 to be recognized is naturally displayed at a predetermined position within this object range 101. The two-dimensional positioning device 105 is driven by the positioning control unit 108 and the camera 103 is positioned at the position facing the recognition object 102 based on the data for position errors of the recognition object 102 that has been obtained in the wide visual field. At this stage, the zoom lens driving unit 7 switches the visual field of the zoom lens 104 to narrow visual field. Therefore, the image information obtained in the narrow visual field is processed by the image processing unit 109 to obtain the data for high-accuracy position errors.

Referring to the case that the positioning mark as shown in FIG. 7 is recognized by using the above explained method, a the image processing is performed to the positioning mark in wide visual field, the camera is moved so that the positioning mark is positioned at the center of the visual field, the visual field is switched to narrow visual field, image processing is performed to the positioning mark, and the positioning correction is performed. Thus, this method is effective only when the most of the positioning marks are not found in the camera with the narrow visual field, but it takes a lot of time to recognize the marks because each of the marks is recognized in wide visual field and then recognized in narrow visual field, which does not allow the method to be applied to any purpose where high productivity is required.

DISCLOSURE OF THE INVENTION

It is an object of this invention to obtain a position error measurement method and a device using a positioning mark which are applicable to any purpose where high accuracy and high productivity are required, and also to obtain a machining device which corrects a position based on the result of measuring position errors using the positioning mark.

A position error measurement method using a positioning mark according to first aspect of this comprises the steps of positioning/fixing a positioning mark on a workpiece to be machined with predetermined accuracy with respect to an image information detection unit; determining, when the positioning mark can be detected by the image information detection unit having a narrow visual field, position errors of the workpiece based on the detected image information; and detecting, when the positioning mark can not be detected by the image information detection unit having the narrow visual field, image information for the positioning mark by the image information detection unit having the wide visual field; correcting a relative position between the image information detection unit having the wide visual field and the workpiece based on the position errors of the workpiece obtained from the detected image information; detecting image information for the positioning mark by the image information detection unit having a narrow visual field; and determining position errors of the workpiece based on the detected image information.

A position error measurement method using a positioning mark according to second aspect of this invention comprises the steps of positioning/fixing the positioning mark on a workpiece to be machined with predetermined accuracy with respect to an image information detection unit; determining, when the positioning mark can be detected by the image information detection unit that can change the size of the visual field set to the narrow visual field, position errors of the workpiece based on the detected image information; and detecting, when the positioning mark can not be detected by the image information detection unit that can change the size of the visual field set to the narrow visual field, image information for the positioning mark by widening the visual field of the image information detection unit; correcting a relative position between the image information detection unit and the workpiece based on the position errors of the workpiece obtained from the detected image information; detecting image information for the positioning mark by narrowing the visual field of the image information detection unit; and determining position errors of the workpiece based on the detected image information.

A position error measurement device using a positioning mark according to a third aspect of this invention comprises a positioning/fixing unit which positions and fixes the positioning mark on a workpiece to be machined with predetermined accuracy with respect to the image information detection unit, a first image information detection unit which has a narrow visual field, and a second image information detection unit which has a wide visual field, and when the first image information detection unit can detect the positioning mark, position errors of the workpiece are determined based on the detected image information, while, when the first image information detection unit can not detect the positioning mark, the second image information detection unit detects image information for the positioning mark, a positioning unit corrects the position errors of the workpiece obtained from the detected image information, the first image information detection unit detects image information for the positioning mark, and then position errors of the workpiece are determined based on the detected image information.

A position error measurement device using a positioning mark according to a fourth aspect of this invention comprises a positioning/fixing unit which positions and fixes the positioning mark on a workpiece to be machined with predetermined accuracy with respect to an image information detection unit, and an image information detection unit which can change the size of its visual field, and when the image information detection unit that has selected a narrow visual field can detect the positioning mark, position errors of the workpiece are determined based on the detected image information, while, when the image information detection unit that has selected the narrow visual field can not detect the positioning mark, image information for the positioning mark is detected by widening the visual field of the image information detection unit, a positioning unit corrects the position errors of the workpiece obtained from the detected image information, image information for the positioning mark is detected by narrowing the visual field of the image information detection unit, and then position errors of the workpiece are determined based on the detected image information.

A machining device which corrects a position based on the result of measuring position error using a positioning mark according to a fifth aspect of this invention comprises a positioning/fixing unit which positions and fixes the positioning mark on a workpiece to be machined with predetermined accuracy with respect to an image information detection unit and a machining unit, a first image information detection unit which has a narrow visual field, and a second image information detection unit which has a wide visual field, and when the first image information detection unit can detect the positioning mark, position errors of the workpiece are determined based on the detected image information, while, when the first image information detection unit can not detect the positioning mark, the second image information detection unit detects image information for the positioning mark, a positioning unit corrects the position errors of the workpiece obtained from the detected image information, the first image information detection unit detects image information for the positioning mark, and position errors of the workpiece are determined based on the detected image information, the positioning unit corrects the position errors of the workpiece obtained from the first image information detection unit, and the machining unit machines the workpiece.

A machining device which corrects a position based on the result of measuring position error using a positioning mark according to a sixth aspect of this invention comprises a positioning/fixing unit which positions and fixes the positioning mark on a workpiece with predetermined accuracy with respect to an image information detection unit and a machining unit, and an image information detection unit which can change the size of its visual field, and when the image information detection unit that has selected a narrow visual field can detect the positioning mark, position errors of the workpiece are determined based on the detected image information, while, when the image information detection unit that has selected the narrow visual field can not detect the positioning mark, image information for the positioning mark is detected by widening the visual field of the image information detection unit, a positioning unit corrects the position errors of the workpiece obtained from the detected image information, image information for the positioning mark is detected by narrowing the visual field of the image information detection unit, position errors of the workpiece are determined based on the detected image information, the positioning unit corrects the position errors of the workpiece obtained from the image information detection unit that has selected the narrow visual field, and the machining unit machines the workpiece.

The present invention produces the effects as follows based on the configuration as explained above.

The first invention is configured to position and fix a positioning mark on a workpiece to be machined with predetermined accuracy with respect to an image information detection unit so that the positioning mark rarely exists outside the image information detection unit having a narrow visual field. When the image information detection unit having a narrow visual field can detect the positioning mark, position errors of the workpiece are then determined from the image information by the image information detection unit having a narrow visual field. Therefore, the data-recognition time in image processing and the time for positioning a workpiece can largely be reduced as compared to the case where each of the positioning marks is recognized in the wide visual field and then recognized in the narrow visual field, which produces such an effect that this invention is also applicable to any purpose where high accuracy and high productivity are required.

The second invention can further improve productivity, in addition to the same effect as that of the first invention, because the travel of an operation for position correction by a positioning unit can be decreased when switching is executed between an image information detection unit having a wide visual field and an image information detection unit having a narrow visual field. Further, there are some more effects that there is no need to match the position of the image information detection unit having a narrow visual field with the position of the image information detection unit having a wide visual field, and the configuration can be more compact.

The third invention and the fifth invention produce the same effect as that of the first invention.

The fourth invention and the sixth invention produce the same effect as that of the second invention.

BEST MODE FOR CARRYING OUT THE INVENTION

First Embodiment

Figure 1:
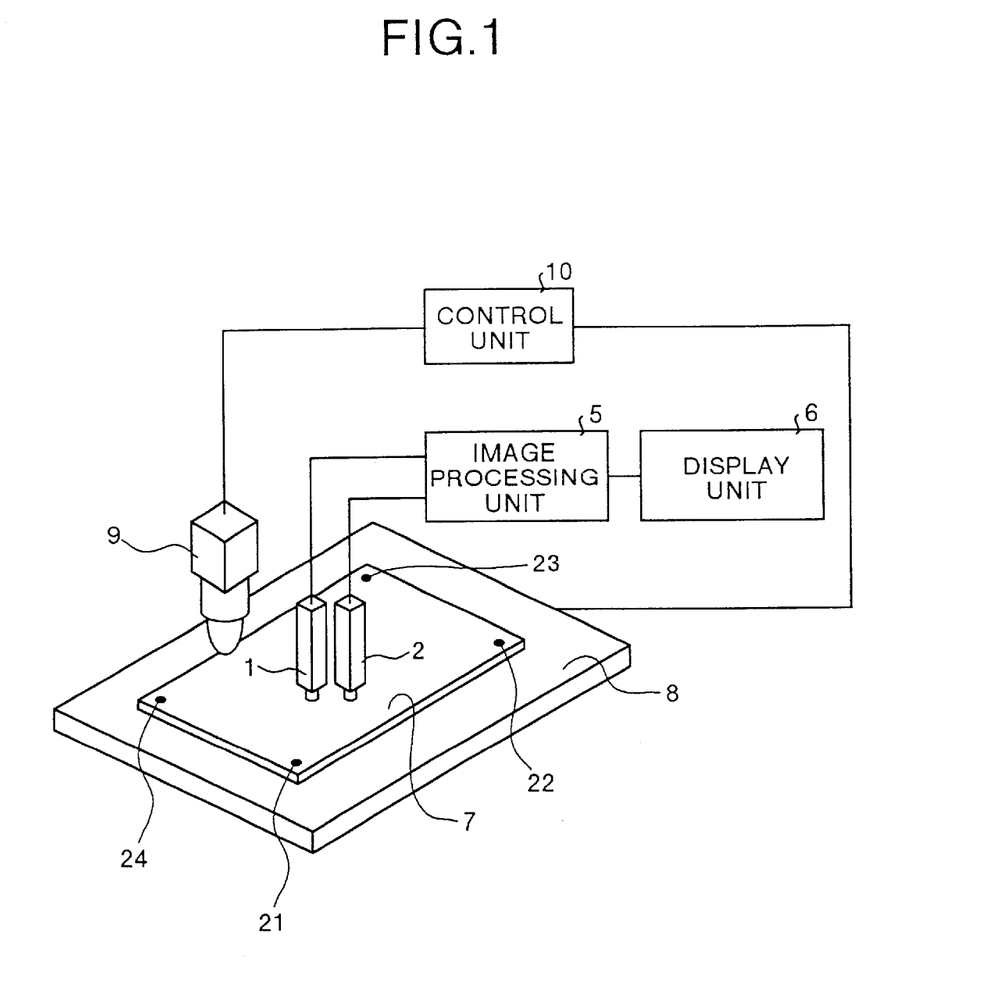
FIG. 1 is a block diagram showing a machining device which corrects a position based on the result of measuring position errors using a positioning mark according to a first embodiment of the present invention.
Figure 2:
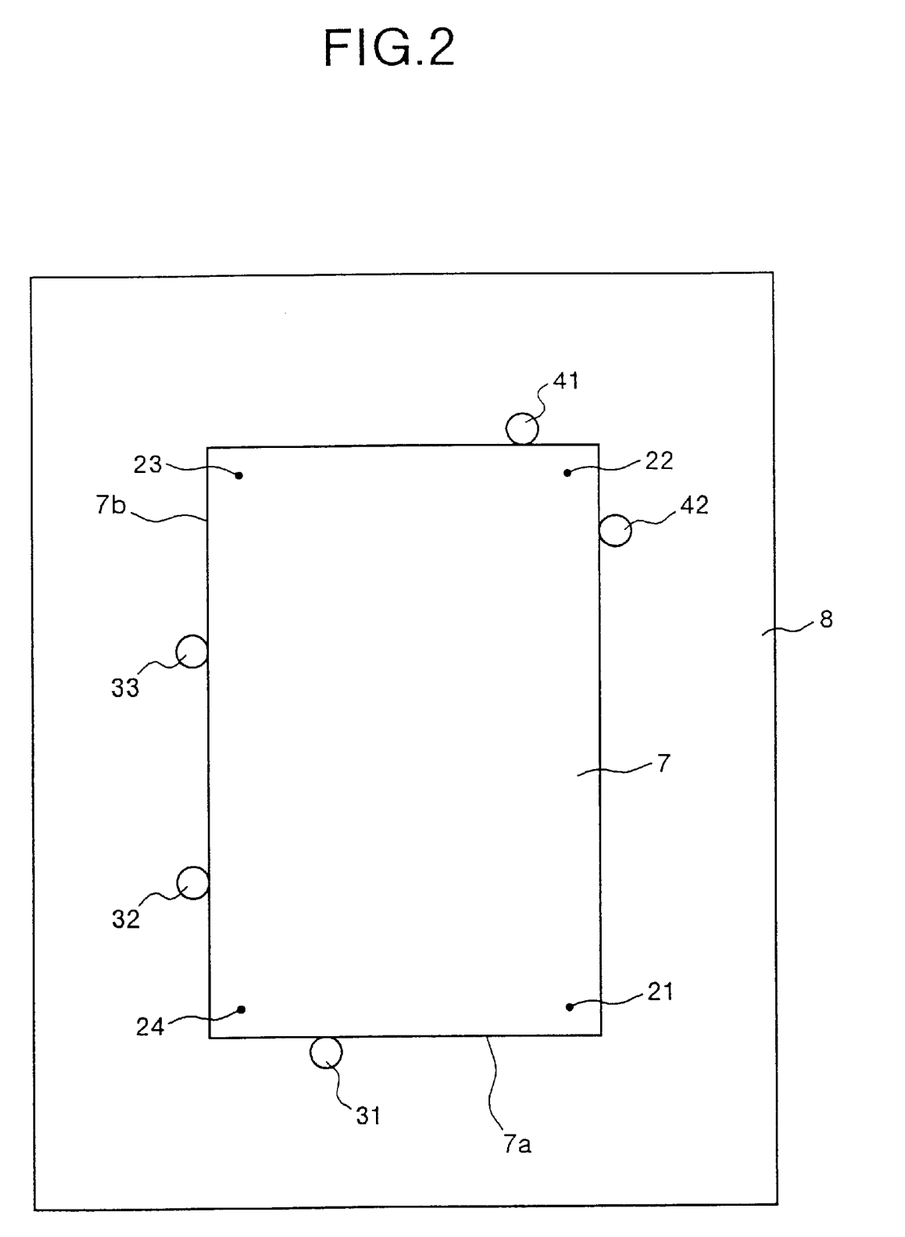
FIG. 2 is an explanatory view of a method for positioning a workpiece to be machined with respect to an XY table in the first embodiment of this invention.

FIG. 1 is a block diagram showing a machining device which corrects a position based on the result of measuring position errors using a positioning mark according to a first embodiment of the present invention. In this FIG. 1 is a camera with a lens having a narrow visual field as an image information detection unit, 2 is a camera with a lens having a wide visual field as an image information detection unit, 5 is an image processing unit which performs image processing to image information from the camera 1, 6 is a display unit which displays the image input from the camera 1 or 2 to the image processing unit 5 and the result of processing in the image processing unit 5, 7 is a workpiece to be machined, 8 is an XY table as a positioning unit which positions the workpiece 7, 9 is a tool as a machining unit which machines a workpiece, 10 is a control unit which provides controls for image processing, positioning correction, and machining, or the like, and 21 to 24 are positioning marks. FIG. 2 is an explanatory view of a method for positioning the workpiece 7 with respect to the XY table 8. In this FIGS. 7a and 7b refer to reference edges of the workpiece 7, 31 to 33 are dowel pins on the XY table, 41 and 42 are fixing pins which fix the workpiece 7 together with the dowel pins and are movably provided on the XY table.

A positioning/fixing unit for the XY table 8 and the positioning marks 21 to 24 is explained below. In FIG. 2, the XY table 8 and the workpiece 7 can be positioned with predetermined accuracy by contacting the reference edges 7a and 7b of the workpiece 7 formed with high accuracy with the dowel pins 31 to 33 located with high accuracy on the XY table 8, and fixing the workpiece with the fixing pins 41 and 42. Further, by forming the positioning marks 21 to 24 of the workpiece 7 with required accuracy based on the reference edges 7a and 7b as a reference, the XY table 8 and the positioning marks 21 to 24 can be positioned with predetermined accuracy. With this configuration, it is possible for a camera having a narrow visual field not to loose the positioning mark from its visual field.

It is difficult to satisfy required accuracy only by mechanical positioning between the XY table and the workpiece as explained above for purposes where high accuracy positioning is required like drilling in a printed board. It is therefore needless to say that position correction based on image processing using a positioning mark is required. Further, these purposes require high productivity, therefore, it is necessary to reduce the air-cut time such as the data-recognition time in image processing.

Figure 3:
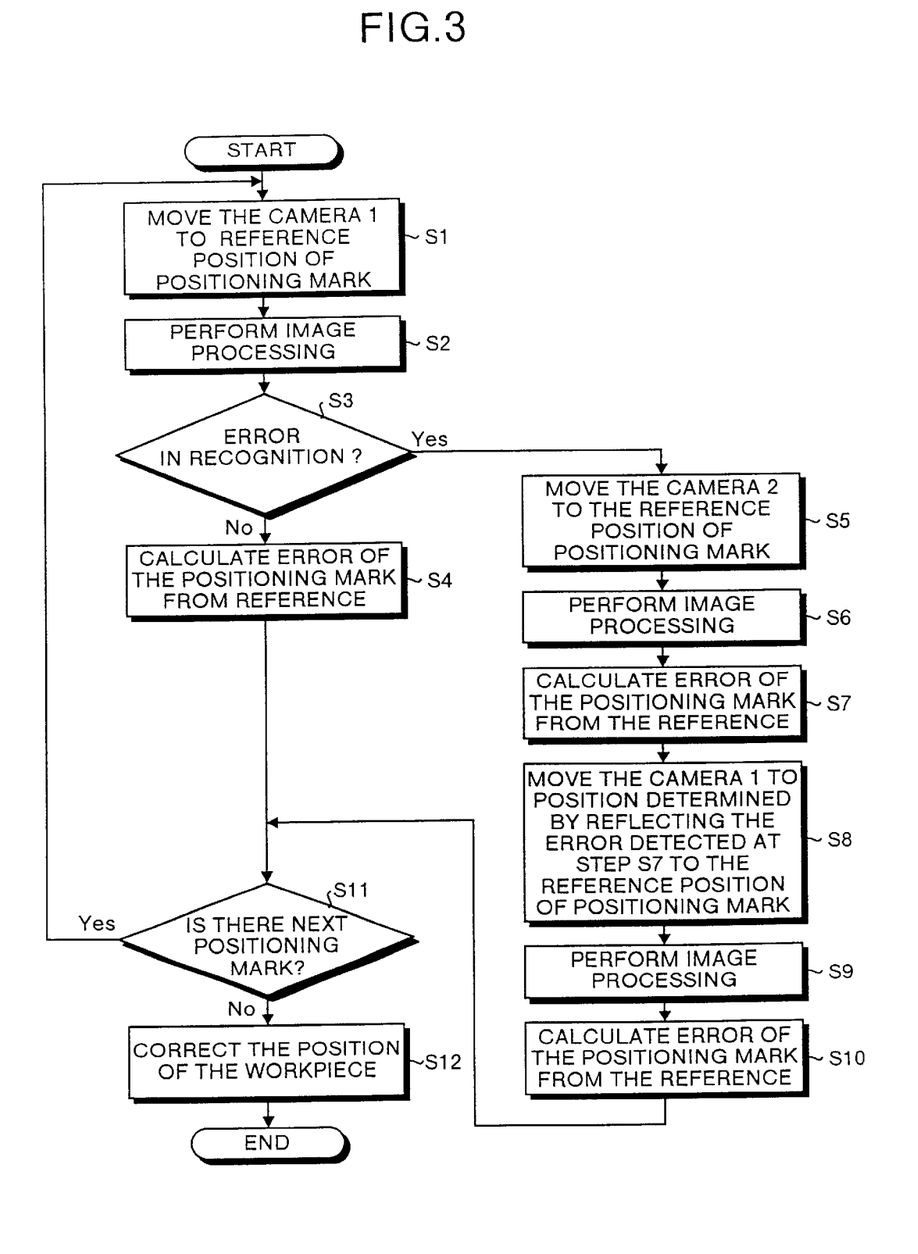
FIG. 3 is a flow chart showing a position error measurement method using a positioning mark in the first embodiment of this invention.
Figure 4:
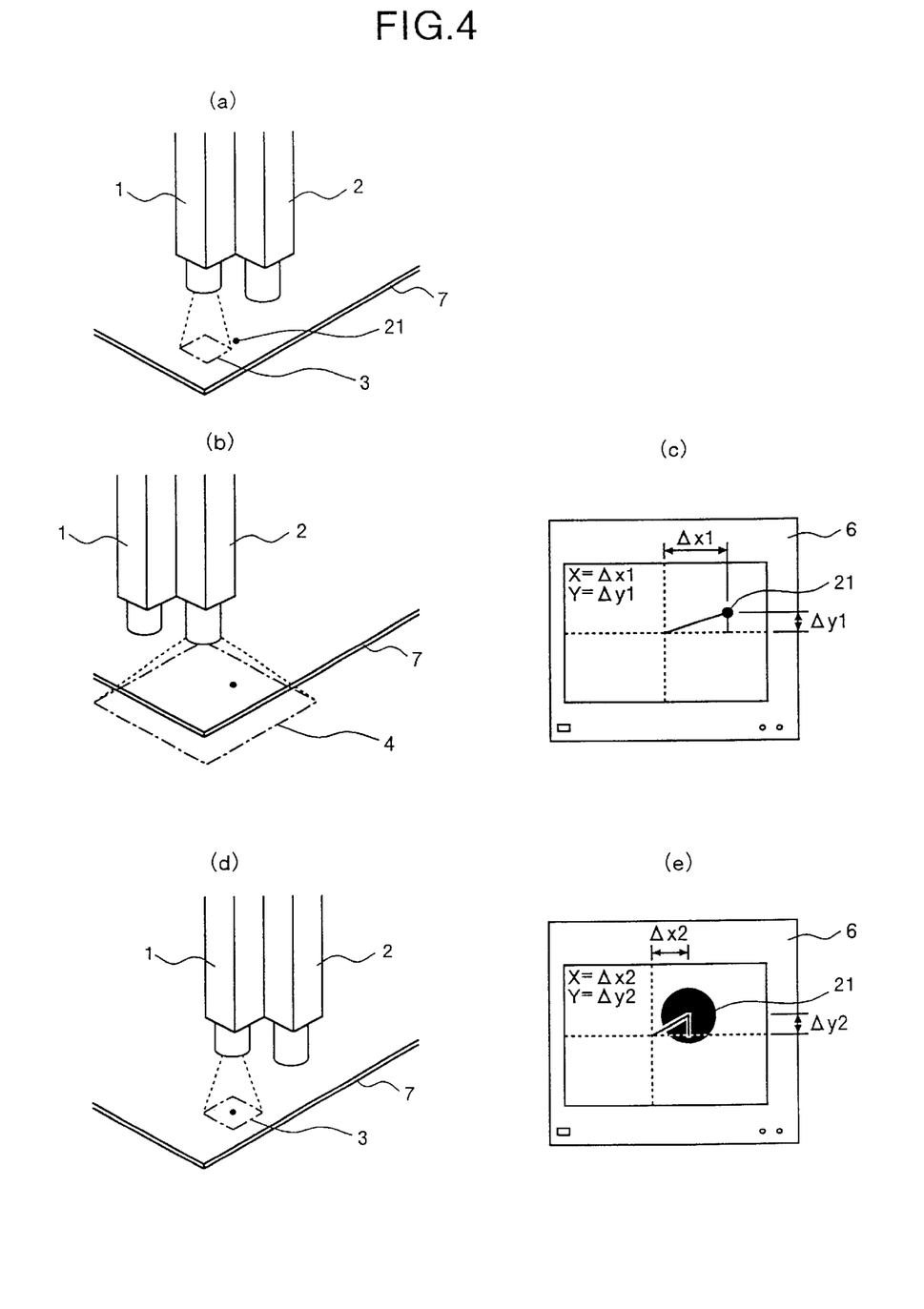
FIG. 4 shows explanatory views how the operation is executed in the position error measurement method using a positioning mark in the first embodiment of this invention.

FIG. 3 is a flow chart showing a position error measurement method using a positioning mark in the first embodiment of this invention. FIG. 4 shows explanatory views of the operation. In FIG. 4, 3 is a narrow visual field, and 4 is a wide visual field.

In FIG. 3, the camera 1 that performs positioning correction is first moves to the reference position of a positioning mark (S1). The camera 1 then performs the image processing (S2) and determines the result of the image processing (S3). At step S3, when the image processing has not resulted in the error in recognition (the case of NO), the position error of the positioning mark (differences between the reference position and the measured position) is calculated (S4). At step S11, it is then determined whether there exists another positioning mark. When an another positioning mark exists (the case of YES), the camera 1 is moved to the position of that positioning mark (S1), and performs the same processing as explained above. When it is determined at step S11 that there is no next positioning mark (the case of NO), the control unit 10 calculates and determines the position error of the workpiece 7 based on the position errors of the positioning marks obtained as explained above, and position correction is performed to the workpiece 7 (S12).

When the image processing has resulted in the error in recognition at step S3 (the case of YES), namely when the positioning mark is not inside the narrow visual field 3 like in FIG. 4(a), the processing from step S5 to step S10 is performed. First of all, the camera 2 with a wider visual field than that of the camera 1 is moved to the reference position of the positioning mark (S5), and performs image processing based on the image input to the camera 2 (S6) (FIG. 4(b)). At step S7, the position error of the positioning mark (differences $\Delta x1$, $\Delta y1$ between the reference position and the measured position) are calculated. FIG. 4(c) shows an example of displaying the result of measuring errors of the positioning mark 21 and the positioning mark 21 (differences $\Delta x1$, $\Delta y1$ between the reference position and the measured position) on the display unit 6. The values of the position errors of the positioning mark (differences $\Delta x1$, $\Delta y1$ between the reference position and the measured position), which have been obtained at step S7, are reflected to the reference position, at this time the camera 1 is moved over the mark (S8) and performs image processing (S9) (FIG. 4(d)), and then the position error of the positioning mark (differences $\Delta x2$, $\Delta y2$ between the reference position and the measured position) are obtained (S10). The display example of the display unit 6 in this case is shown in FIG. 4(e). The process then proceeds to step S11, and the same process as explained above is executed. As for these results of measuring the position errors of the positioning mark, the values $\Delta x2$ and $\Delta y2$ indicate a higher degree of accuracy.

The switching between the cameras (from 1 to 2, from 2 to 1) and the change in parameters required for switching are automatically performed by the control unit 10 shown in FIG. 1 by using previously obtained correction data.

Although the example of moving the workpiece 7 by using the XY table with respect to the tool 9 and the cameras 1 and 2 is shown in the above explanation, the workpiece 7 may be fixed and the tool 9 and the cameras 1 and 2 may be moved with respect to the workpiece The positioning/fixing unit provided for the XY table 8 and the positioning marks 21 to 24 is not limited to the above explained positioning/fixing unit, and any other method, for example a positioning guide or a vacuum suction machine, may be employed on condition that the positioning between the XY table 8 and the positioning marks 21 to 24 can be performed.

Further, although the camera is shown as an example of the image information detection unit, it is not limited to the camera, thus, any device enabling detection of various visual information such as a semiconductor image sensor or the like can be employed.

Based on the configuration as explained above, it is configured that a positioning mark on a workpiece to be machined is positioned and fixed with predetermined accuracy with respect to the image information detection unit, and that the positioning mark rarely exists outside the image information detection unit having a narrow visual field. When the image information detection unit having the narrow visual field can detect the positioning mark, position errors of the workpiece are determined from the image information by the image information detection unit having the narrow visual field. The image information detection unit having a wide visual field is used only in a required occasion as an auxiliary for the image information detection unit having a narrow visual field. Therefore, as compared to the case where each of the positioning marks is recognized in wide visual field and then recognized in narrow visual field without fail, the data-recognition time in image processing and the time for positioning a workpiece can largely be reduced, thus, this invention can also be used for any purpose where high accuracy and high productivity are required.

Second Embodiment

Figure 5:
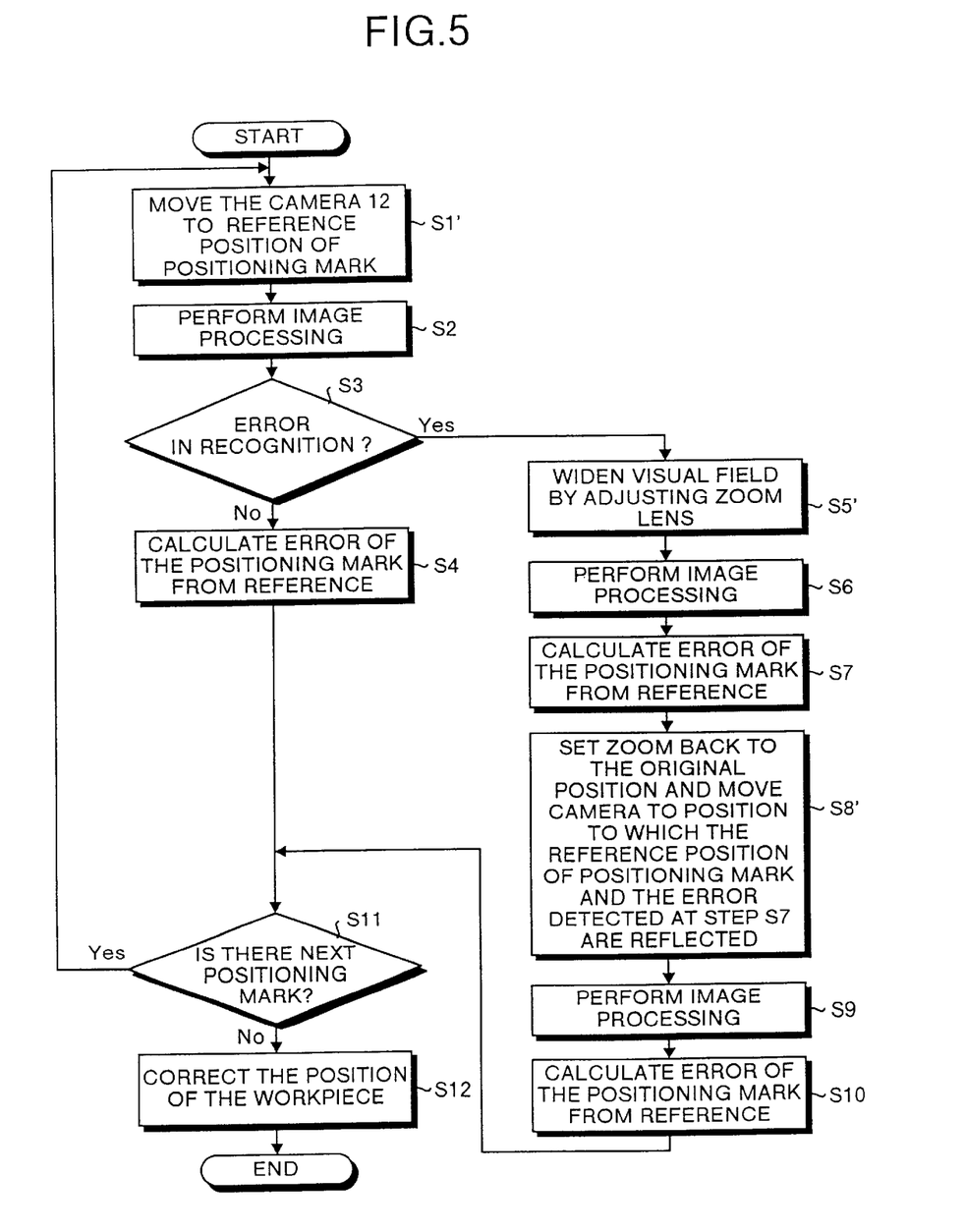
FIG. 5 is a flow chart showing a position error measurement method using a positioning mark according to a second embodiment of the invention.
Figure 6:
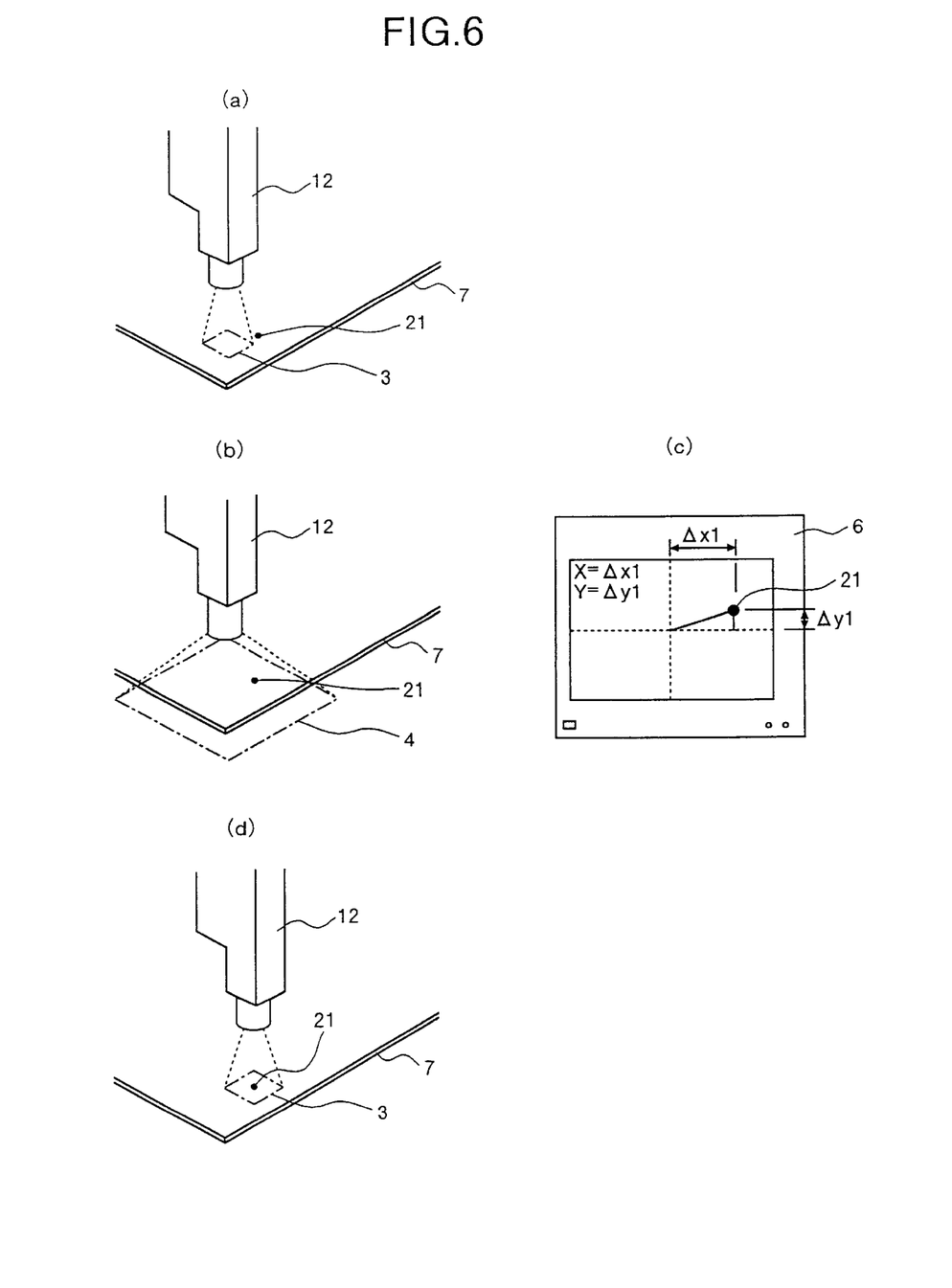
FIG. 6 shows explanatory views how the operation is executed in the position error measurement method using a positioning mark in the second embodiment of this invention.

FIG. 5 is a flow chart showing a position error measurement method using a positioning mark according to a second embodiment of the invention. FIG. 6 shows explanatory views of operation in the method. In FIG. 6, 12 is a camera, which can change the size of a visual field as an image information detection unit, and uses a zoom lens as an example.

In FIG. 5, explanation about the same sections as those in the first embodiment is omitted. When the image processing has resulted in the error in recognition at step S3 in FIG. 5 (the case of YES), namely, when the positioning mark is not within the narrow visual field like in FIG. 6(a), the processing from step S5' to step S10 is performed.

The visual field of the camera 12 which can change the size of its visual field is first widened (S5'), and image processing is performed (S6) (FIG. 6(b)). At step S7, the position error of the positioning mark (differences $\Delta x1$, $\Delta y1$ between the reference position and the measured position) are obtained. FIG. 6(c) shows an example of displaying the result of measuring errors of the positioning mark 21 and the positioning mark 21 (differences $\Delta x1$, $\Delta y1$ between the reference position and the measured position) on the display unit 6. The visual field of the camera 12 is set back to the original size (changed to the narrow visual field), and also the values of the position errors of the positioning mark (differences Δx1, Δy1 between the reference position and the measured position), which have been obtained at step S7, are reflected to the reference position, and the camera 12 is moved (S8') over the mark to perform image processing (S9) (FIG. 6(d)).

Based on the configuration as explained above, the same effect as that of the first embodiment can be produced, and at the same time productivity can further be improved because the distance of movement of the positioning unit can be decreased when switching is executed between an image information detection unit having a wide visual field and an image information detection unit having a narrow visual field. Further, there are some more effects such as there is no need to match the position of the image information detection unit having the narrow visual field with the position of the image information detection unit having the wide visual field, and the configuration can be more compact.

INDUSTRIAL APPLICABILITY

As explained above, the method of and the device for measuring position errors using a positioning mark as well as the machining device based on the result of measuring position errors using the positioning mark according to the present invention are suitable to be used for any purpose where high accuracy and high productivity are required.

What is claimed is:

1. A position error measurement method using a positioning mark comprising the steps of:

detecting a positioning mark on a workpiece to be machined in the form of image information using an image information detection unit, said unit comprising a first detector having a narrow visual field and a second detector having a wide visual field;

performing image processing of the image information to measure position error of said positioning mark;

determining the position error of said workpiece based on the position error of said positioning mark;

position/fixing said positioning mark with predetermined accuracy with respect to said image information detection unit;

when said positioning mark can be detected by said first detector of said image information detection unit determining a position error of said workpiece based on first detected image information; and when said positioning mark can not be detected by said first detector of said image information detection unit, detecting the image information for said positioning mark by said second detector of said image information detection unit;

correcting a relative position between said second detector of said image information detection unit and said workpiece based on the position errors of said workpiece obtained from second detected image information;

detecting first image information for said positioning mark by said first detector of said image information detection unit; and determining a position error of said workpiece based on the detected first image information.

2. A position error measurement method using a positioning mark comprising the steps of:

detecting a positioning mark on a workpiece to be machined in the form of image information using an image information detection unit, said image information detecting unit being adapted to change the size of a visual field by widening a first visual field and narrowing a second visual field;

performing image processing of the image information to measure position error of said positioning mark;

deterring the position error of said workpiece based on the position error of said positioning mark;

positioning/fixing said positioning mark with predetermined accuracy with respect to said image information detection unit;

wherein, when said positioning mark can be detected by said image information detection unit using said first visual field set to a narrow visual field, determining the position error of said workpiece based on the detected image information; and when said positioning mark can not be detected by said image information detection unit first visual field, detecting the image information for said positioning mark by widening the visual field of said image information detection unit to said second visual field;

correcting a relative position between said image information detection unit and said workpiece based on the position error of said workpiece obtained from the detected image information;

detecting image information for said positioning mark by narrowing the second visual field of said image information detection unit; and determining position error of said workpiece based on the detected image information.

3. A position error measurement device comprising:

an image information detection unit which detects a positioning mark on a workpiece to be machined in the from of image information;

an image processing unit which performs image processing to the image information to measure position error of said positioning mark;

a control unit which measures position error of said workpiece based on the position error of said positioning mark;

a positioning unit which relatively moves said workpiece and said image information detection unit and thus corrects the position error of said workpiece;

a positioning/fixing unit which positions and fixes said positioning mark with predetermined accuracy with respect to said image information detection unit;

a first image information detection unit which has a narrow visual field; and a second image information detection unit which has a wide visual field, wherein, when said first image information detection unit can detect said positioning mark, position error of said workpiece is determined based on the detected image information; and when said first image information detection unit can not detect said positioning mark, said second image information detection unit detects image information for said positioning mark, said positioning unit corrects the position error of said workpiece obtained from the detected image information, said first image information detection unit detects image information for said positioning mark, and position error of said workpiece is determined based on the detected image information.

4. A position error measurement device comprising:
an image information detection unit which detects a positioning mark on a workpiece to be machined in the from of image information;
an image processing unit which performs image processing to the image information to measure position error of said positioning mark;
a control unit which measures position error of said workpiece based on the position error of said positioning mark;
a positioning unit which relatively moves said workpiece and said image information detection unit and thus corrects the position error of said workpiece;
a positioning/fixing unit which positions and fixes said positioning mark with predetermined accuracy with respect to said image information detection unit; and
an image information detection unit which can change the size of its visual field,
wherein, when said image information detection unit that has selected the narrow visual field can detect said positioning mark, position error of said workpiece determined based on the detected image information; and
when said image information detection unit that has selected the narrow visual field can not detect said positioning mark, image information for said positioning mark is detected by widening the visual field of said image information detection unit, said positioning unit corrects the position error of said workpiece obtained from the detected image information, image information for said positioning mark is detected by narrowing the visual field of said image information detection unit, and position error of said workpiece is determined based on the detected image information.

5. A machining device comprising:
an image information detection unit which detects a positioning mark on a workpiece to be machined in the form of image information;
an image processing unit which performs image processing to the image information to measure position error of said positioning mark;
a control unit which measures position error of said workpiece based on the position error of said positioning mark; a positioning unit which relatively moves said workpiece, said image information detection unit, and a machining unit and thus corrects the position error of said workpiece;
a positioning/fixing unit which positions and fixes said positioning mark with predetermined accuracy with respect to said image information detection unit and said machining unit;
a first image information detection unit which has a narrow visual field; and
a second image information detection unit which has a wide visual field,
wherein, when said first image information detection unit can detect said positioning mark, position error of said workpiece is determined based on the detected image information;
when said first image information detection unit can not detect said positioning mark, said second image information detection unit detects image information for said positioning mark, said positioning unit corrects the position error of said workpiece obtained from the detected image information, said first image information detection unit detects image information for said positioning mark, and position error of said workpiece is determined based on the detected image information; and
image said positioning unit corrects the position error of said workpiece obtained from said first image information detection unit, and said machining unit machines said workpiece.

6. A machining device comprising:
an image information detection unit which detects a positioning mark on a workpiece to be machined in the form of image information;
an image processing unit which performs image processing to the image information to measure position error of said positioning mark;
a control unit which measures position error of said workpiece based on the position error of said positioning mark; a positioning unit which relatively moves said workpiece, said image information detection unit, and a machining unit and thus corrects the position error of said workpiece;
a positioning/fixing unit which positions and fixes said positioning mark with predetermined accuracy with respect to said image information detection unit and said machining unit; and
an image information detection unit which can change the size of its visual field,
wherein, when said image information detection unit that has selected the narrow visual field can detect said positioning mark, position error of said workpiece is determined based on the detected image information;
when said image information detection unit that has selected the narrow visual field can not detect said positioning mark, image information for said positioning mark is detected by widening the visual field of said image information detection unit; said positioning unit corrects the position errors of said workpiece obtained from the detected image information; image information for said positioning mark is detected by narrowing the visual field of said image information detection unit; and position error of said workpiece is determined based on the detected image information; and
said positioning unit corrects the position error of said workpiece obtained from said image information detection unit that has selected the narrow visual field, and said machining unit machines said workpiece.

* * * * *